(12) United States Patent
Zhang et al.

(10) Patent No.: US 12,396,075 B2
(45) Date of Patent: Aug. 19, 2025

(54) BLUE ORGANIC ELECTROLUMINESCENCE DEVICE, DISPLAY PANEL AND DISPLAY APPARATUS

(71) Applicant: BOE TECHNOLOGY GROUP CO., LTD., Beijing (CN)

(72) Inventors: Dongxu Zhang, Beijing (CN); Rongrong Gao, Beijing (CN); Lixia Qiu, Beijing (CN); Yang Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 829 days.

(21) Appl. No.: 17/606,840

(22) PCT Filed: Dec. 17, 2020

(86) PCT No.: PCT/CN2020/137230
§ 371 (c)(1),
(2) Date: Oct. 27, 2021

(87) PCT Pub. No.: WO2022/126499
PCT Pub. Date: Jun. 23, 2022

(65) Prior Publication Data
US 2022/0418059 A1    Dec. 29, 2022

(51) Int. Cl.
*H01L 51/50*    (2006.01)
*H05B 33/10*    (2006.01)
(Continued)

(52) U.S. Cl.
CPC ............ *H05B 33/14* (2013.01); *H05B 33/10* (2013.01); *H10K 50/155* (2023.02); *H10K 85/615* (2023.02); *H10K 85/622* (2023.02)

(58) Field of Classification Search
None
See application file for complete search history.

(56) References Cited

U.S. PATENT DOCUMENTS

| | | | |
|---|---|---|---|
| 7,801,716 B2 | 9/2010 | Freier | |
| 2004/0164292 A1* | 8/2004 | Tung | ............ H01L 35/24 257/40 |

(Continued)

FOREIGN PATENT DOCUMENTS

| | | |
|---|---|---|
| CN | 102214795 A | 10/2011 |
| CN | 203288658 U | 11/2013 |

(Continued)

OTHER PUBLICATIONS

Wu, Shikang, "The Problem on Photophysics and Photochemistry of Organic Compounds Possessing Ability of Fluorescence Emission," Progress in Chemistry, vol. 17, No. 1, Jan. 2005. 25 pages.

(Continued)

*Primary Examiner* — Gregory D Clark
(74) *Attorney, Agent, or Firm* — Perilla Knox & Hildebrandt LLP; Kenneth A. Knox

(57) ABSTRACT

The present disclosure provides a blue organic electroluminescence device, a display panel, and a display apparatus. A blue organic electroluminescence device includes a light-emitting layer having a matrix material and a blue fluorescent doping material doped in the matrix material, where dipole moments of the matrix material and the blue fluorescent doping material are both 0 to 1 D, which can ensure higher energy transfer efficiency and charge balance, ensure that an emission spectrum is a narrow spectrum, and thus have better color purity and higher external quantum Efficiency (EQE) to obtain the blue organic electroluminescence devices with high color purity and high luminous efficiency.

18 Claims, 1 Drawing Sheet

(51) Int. Cl.
   *H05B 33/14* (2006.01)
   *H10K 50/155* (2023.01)
   *H10K 85/60* (2023.01)

(56) References Cited

U.S. PATENT DOCUMENTS

| | | | |
|---|---|---|---|
| 2007/0032000 A1* | 2/2007 | Yeh | G09G 3/3648 |
| | | | 438/149 |
| 2007/0124121 A1 | 5/2007 | Freier | |
| 2010/0051997 A1 | 3/2010 | Jwo-Huei | |
| 2010/0051998 A1 | 3/2010 | Jou | |
| 2011/0049486 A1* | 3/2011 | Kwak | H05B 33/14 |
| | | | 548/426 |
| 2011/0240969 A1 | 10/2011 | Kim | |

FOREIGN PATENT DOCUMENTS

| | | |
|---|---|---|
| CN | 105390522 A | 3/2016 |
| CN | 111630676 A | 9/2020 |
| EP | 2372807 A2 | 5/2011 |
| EP | 23728072 A2 | 10/2011 |
| EP | 2372807 B1 | 11/2016 |
| JP | 2017126598 A | 7/2017 |
| TW | 201012293 A | 3/2010 |
| TW | 201012294 A | 3/2010 |
| WO | 2007064627 A1 | 6/2007 |

OTHER PUBLICATIONS

Qin, Anjun, "Guest-Host Poled Polymers With High Loading Level by Using Chromophores With Small Dipole Moment," Journal of Nonlinear Optical Physics and Materials, vol. 15, No. 2, Mar. 2006. pp. 227-238.

Liu, Weiqiang, "Recent Progress on Blue Delayed Flourescent Materials and Devices," Chinese Journal of Applied Chemistry, vol. 36, Issue 1, Jan. 2019. 9 pages.

Written Opinion for PCT Patent Application No. PCT/CN2020/137230 mailed Sep. 23, 2021.

* cited by examiner

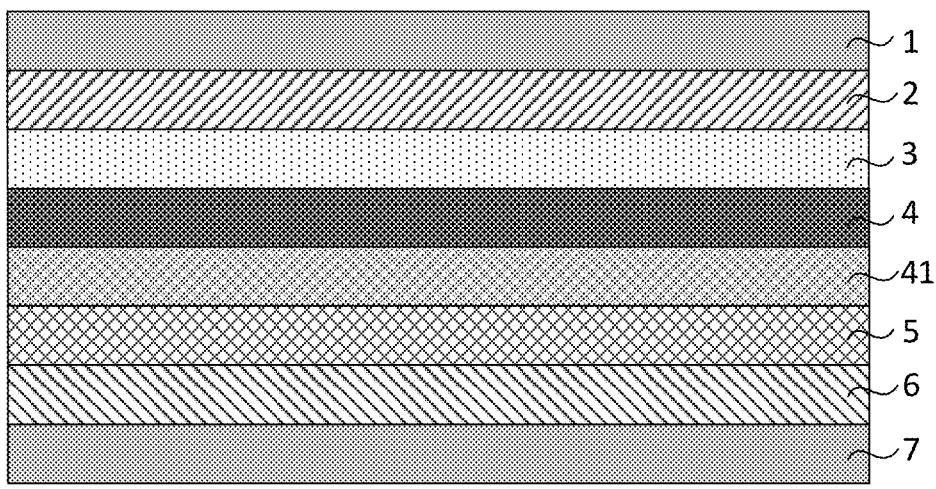

BLUE ORGANIC ELECTROLUMINESCENCE DEVICE, DISPLAY PANEL AND DISPLAY APPARATUS

CROSS-REFERENCE TO RELATED APPLICATION

The present application is a national phase application under 35 U.S.C. § 371 of International Application No. PCT/CN2020/137230 filed on Dec. 17, 2020, the entire contents of which are hereby incorporated by reference.

TECHNICAL FIELD

The present disclosure relates to the field of display technologies and, in particular, a blue organic electroluminescence device, a display panel, and a display apparatus.

BACKGROUND

Organic light emitting diode (OLED) display technologies are considered a third generation display technology, and have become a main development direction in the field of display technologies due to their advantages of lightness, thinness, self-luminescence, wide viewing angle, fast response speed, low brightness, low power consumption, and so forth.

OLED display technologies use organic materials to convert electrical energy into light energy, and typically include an anode, a cathode, and an organic material layer sandwiched therebetween. When a voltage is applied across the two electrodes, holes and electrons are injected into the organic material layer from the anode and the cathode, respectively, and the injected holes and electrons form excitons when they meet each other. The light is emitted when these excitons return to a ground state.

It should be noted that the information disclosed in the Background section above is only for enhancing the understanding of the background of the present disclosure, and thus may include information that does not constitute prior art known to those of ordinary skill in the art.

BRIEF SUMMARY

An objective of the present disclosure is to provide a blue organic electroluminescence device, a display panel, and a display apparatus.

According to an aspect of the present disclosure, there is provided a blue organic electroluminescence device, including:
a light-emitting layer, including a matrix material and a blue fluorescent doping material doped in the matrix material, wherein dipole moments of the matrix material and the blue fluorescent doping material are both 0 to 1 D.

In an exemplary embodiment of the present disclosure, the matrix material is selected from anthracene derivatives.

In an exemplary embodiment of the present disclosure, the matrix material is selected from one or any combination of 9,10-bi-(naphthalene-2-yl) anthracene, 2-methyl-9,10-bis(naphthalene-2-yl) anthracene and 9,9',10,10'-tetraphenyl-2,2'-bianthracene.

In an exemplary embodiment of the present disclosure, the blue fluorescent doping material is selected from one or any combination of pyrene derivatives, fluorene derivatives, and fused ring compounds.

In an exemplary embodiment of the present disclosure, the doping material is selected from (E)-N,N-diphenyl-4-(4-(pyrene-1-yl) styryl) aniline, 9,9,9',9',9'',9''-hexamethyl-N,N'-di-2-naphthyl-N,N'-diphenyl-[2,2': 7',2''-triple-9H-fluorene]-7,7''-diamine.

In an exemplary embodiment of the present disclosure, the blue organic electroluminescence device further includes a hole transport layer located on a side of the light-emitting layer, wherein a dipole moment of a material of the hole transport layer is 0 to 2 D.

In an exemplary embodiment of the present disclosure, the blue organic electroluminescence device further includes a hole auxiliary layer located between the hole transport layer and the light-emitting layer, wherein a dipole moment of a material of the hole auxiliary layer is 0 to 2 D.

In an exemplary embodiment of the present disclosure, the dipole moment of the material of the hole auxiliary layer is greater than the dipole moment of the material of the hole transport layer.

In an exemplary embodiment of the present disclosure, the material of the hole transport layer and/or the material of the hole auxiliary layer are/is selected from aromatic amine derivatives.

In an exemplary embodiment of the present disclosure, the material of the hole transport layer and/or the material of the hole auxiliary layer are/is selected from one or a combination of N,N'-diphenyl-N,N'-(1-naphthyl)-1,1'-biphenyl-4,4'-diamine and N,N'-diphenyl-N, N'-bis(3-methylphenyl)-1,1'-biphenyl-4,4'-diamines.

In an exemplary embodiment of the present disclosure, the blue organic electroluminescence device further includes a hole injection layer located on a side of the hole transport layer away from the light-emitting layer, wherein a dipole moment of a material of the hole injection layer is greater than 2 D.

In an exemplary embodiment of the present disclosure, the hole injection layer includes a first hole injection material and a second hole injection material same as the material of the hole transport layer, wherein the dipole moment of the material of the hole injection layer is a common dipole moment of a dimer combined by the first hole injection material and the second hole injection material.

In an exemplary embodiment of the present disclosure, the first hole injection material is selected from one of any combination of 2,3,5,6-tetrafluoro-7,7',8,8'-tetracyanodimethyl-p-benzeneQuinone, 7,7,8,8-tetracyanoquinodimethane, 2,3,6,7,10,11-hexacyano-1,4,5,8,9,12-hexaazide, 4,4', 4''-tris[2-naphthylphenylamino]triphenylamine, axene or quinone compounds.

According to another aspect of the present disclosure, there is provided a display panel including the blue organic electroluminescence device described above.

According to still another aspect of the present disclosure, there is provided a display apparatus including the above-mentioned display panel.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

FIG. 1 is a schematic diagram of a film structure of a blue organic electroluminescence device.

DETAILED DESCRIPTION

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the exemplary embodiments to those skilled in this art. The same reference numerals in the drawings denote the same or similar parts, and the repeated description thereof will be omitted.

The embodiments of the present disclosure provide a blue organic electroluminescence device, and the blue organic electroluminescence device includes a light-emitting layer 4 including a matrix material (BH) and a blue fluorescent doping material (BD) doped in the matrix material. Dipole moments of the matrix material and the blue fluorescent doping material are both 0 to 1 D.

The dipole moment is a product of a distance between centers of positive and negative charges and a quantity of charges in the charge centers, and is a vector whose direction is specified from the center of the positive charge to the center of the negative charge, the diple moment is represented with a symbol u with the unit D (Debye). In some cases, a magnitude of the dipole moment defined in Debye can be used to measure a magnitude of molecule polarity. When the molecular dipole moment is less than 1 Debye, the molecule can be considered as a non-polar molecule, and when the molecular dipole moment is greater than 1 Debye, the molecule can be considered as a polar molecule. The polarity of the compound molecule represents a charge distribution inside the molecule, which can well show transport characteristics of holes and electrons. A polarity matching between different functional layers plays a vital role in the efficiency and life of the device. Non-polar molecules are approximately electrically neutral in structure. In contrast, polar compounds have some of the atoms that have partial positive or negative charges.

In the light-emitting layer 4 of the blue organic electroluminescence device, the dipole moment of the matrix material is limited to 0 to 1 D, that is, non-polar molecules, which can ensure higher energy transfer efficiency and charge balance. The dipole moment of the blue fluorescent doping material is limited to 0 to 1 D, and it is also the non-polar molecule, which can ensure that an emission spectrum is a narrow spectrum, thereby achieving the better color purity and higher external quantum efficiency (EQE). The matching of the matrix material and the blue fluorescent doping material can make electrons easily trapped by the blue fluorescent doping material, and is more conducive to the balance of electrons and holes in the light-emitting layer, so that a small full width at half maximum (FWHM) can be obtained, and then the higher external quantum efficiency can be obtained, and the light-emitting efficiency and lifetime of the device can be improved. In addition, since the electrons are easily trapped by the blue fluorescent doping material, the luminescence of the blue fluorescent doping material can be promoted, while the luminescence of the matrix material is suppressed. Moreover, an interaction between the matrix material and the blue fluorescent doping material can be inhibited. As a result, the color purity of the light-emitting device can be improved. In short, a blue organic electroluminescence device with high color purity and high luminous efficiency can be obtained. When the dipole moment of the matrix material in the light-emitting layer is greater than 1 D, it is not conducive to the balance of electrons and holes in the light-emitting layer, and the interaction with adjacent layers increases, resulting in a decrease in efficiency. In addition, doping a dopant material with a dipole moment greater than 1 D into a polar matrix material would increase the half-height width and cause deterioration of the color purity.

The blue organic electroluminescence device according to the embodiments of the present disclosure will be described in detail below.

An electric dipole moment can be calculated or measured using a commercial dipole meter or in solution. All the dipole moments given herein are obtained by the widely used and known software by those skilled in the art and the commercially available molecular modeling and computing chemistry software "Spartan 18". The DFT (Density Functional in Theory) method is used to calculate a dipole moment of an equilibrium geometry in a ground state under a computing level B3LYP/6-31g*. If there is more than one conformation in a compound, a conformation with the lowest total energy is selected to determine the dipole moment.

Reference numerals for FIG. 1: 1. cathode; 2. electron injection layer; 3. electron transport layer; 4. light-emitting layer; 41. hole auxiliary layer; 5. hole transport layer; 6. hole injection layer; and 7. anode.

Referring to FIG. 1, which is a schematic structural diagram of a blue organic electroluminescence device, the blue organic electroluminescence device includes an anode 7, a cathode 1, and a light-emitting layer 4 (EML) located between the two electrodes.

The matrix material with the dipole moment of 0 to 1 D in the light-emitting layer 4 can be an anthracene matrix material. The anthracene matrix material has a blue light characteristic, good planarity, and a large conjugate plane, which is conducive to carrier transport. In addition, the anthracene is easy to modify and simple in structure, which is convenient for chemical synthesis. For example, the anthracene matrix material may specifically be one or any combination of ADN, MADN, and TPBA, where ADN represents 9,10-bi-(2-naphthyl) anthracene with a dipole moment 0.05 Debye. MADN represents 2-methyl-9,10-bi-(2-naphthyl) anthracene with a dipole moment 0.49 Debye. TPBA represents 9,9',10,10'-tetraphenyl-2,2'-bianthracene with a dipole moment 0.05 Debye.

The blue fluorescent doping material with the dipole moment of 0 to 1 D in the light-emitting layer 4 may be a pyrene derivative, a fluorene derivative, a fused ring compound, and the like. Further, the blue fluorescent doping material is, in some embodiments, one or a combination of BSBF and BNP3F. BNP3FL represents 9,9,9',9',9",9"-hexamethyl-N,N'-di-2-naphthyl-N,N'-diphenyl-[2,2': 7',2"-triple-9H-fluorene]-7,7"-diamine with a dipole moment 0.46 Debye. BSBF represents 2-(9,9-spirobifluorene-2-yl)-9,9-spirobifluorene with a dipole moment 0.27 Debye.

In an embodiment, referring to FIG. 1, the blue organic electroluminescence device further includes a hole transport layer 5 (HTL) disposed on a side of the light-emitting layer 4 facing the anode 7 and used for transporting the holes. A dipole moment of a material of the hole transport layer 5 is 0 to 2 D, and an excessively high dipole moment will result in a significant decrease in the luminous efficiency.

The material of the hole transport layer 5 can be an arylamine derivative, a carbazole derivative, etc., which has the good hole mobility and an ideal hole transport material. For example, the material of the hole transport layer is, in some embodiments, one or a combination of NPB and TPD. NPB represents N,N'-diphenyl-N,N'-(1-naphthyl)-1,1'-biphenyl-4,4'-diamine with a dipole moment 0.79 Debye. TPD represents N,N'-diphenyl-N,N'-bis(3-methylphenyl)-1,1'-biphenyl-4,4'-diamine with a dipole moment 0.24 Debye. HT01 represents 9-([1,1':4',1"-terphenyl]-4-yl)-3-(dibenzo[b,d]furan-2-yl)-b-(dibenzo[b,d]furan-4-yl)-9H-carbazole with a dipole moment 1.98 Debye.

In an embodiment, referring to FIG. 1, the light-emitting device further includes a hole injection layer 6 (HIL) disposed between the hole transport layer 5 and the anode 7, that is, disposed on a side away from the light-emitting layer 4, and used for improving the hole injection efficiency. A dipole moment of a material of the hole injection layer is greater than 2 D. When the dipole moment is in this range, it is beneficial to attract the holes, thereby improving the injection performance of the holes. If the dipole moment of the material is too low, it will be difficult for the holes to be injected into the device, resulting in a higher voltage and extremely low efficiency of the device.

In the embodiments, the hole injection layer 6 includes a first hole injection material and a second hole injection material, that is, the hole injection layer is a dimer composed of two component materials. The second hole injection material is, in some embodiments, the same as the material of the hole transport layer, so that the energy level transition between the hole injection layer and the hole transport layer is smoother and the transition interface is eliminated.

For the hole injection layer with the two-component material, the dipole moment is a common dipole moment of the dimer combined by the first hole injection material and the second hole injection material, and the dimer may be, for example, formed by the interaction such as the Van der Waals force. In addition, it should be noted that the present disclosure does not limit a mass ratio of the first hole injection material and the second hole injection material, no matter in which mass ratio these two materials are combined. It is only ensured that the common dipole moment formed by them is greater than 2 D.

The first hole injection material and the second hole injection material may be selected from phthalocyanine compounds, aromatic amine compounds and the like. In some embodiments, the first hole injection material is selected from one or any combination of F4-TCNQ, TCNQ, HAT-CN, 2T-NATA, axene or quinone compounds. F4-TCNQ represents 2,3,5,6-tetrafluoro-7,7',8,8'-tetracyanodimethyl-p-benzoquinone with a dipole moment 0.02 Debye. TCNQ represents 7,7,8,8-tetracyanoquinodimethane with a dipole moment 0 Debye. HAT-CN represents 2,3,6,7,10,11-hexacyano-1,4,5,8,9,12-hexaazatriphenylene with a dipole moment 0 Debye. 2T-NATA represents 4,4',4"-tris[2-naphthylphenylamino]triphenylamine with a dipole moment 0.52 Debye.

Taking the first hole injection material as HAT-CN and the second hole injection material as NPB as an example, the dipole moment of HAT-CN is 0 Debye, the dipole moment of NPB is 0.79 Debye, and the dipole moment of the hole injection layer is the dipole moment of the dimer combined by the HAT-CN and NPB, which is 2.84. Taking the first hole injection material as F4-TCNQ and the second hole injection material as TPD as an example, the dipole moment of F4-TCNQ is 0.02 Debye, the dipole moment of TPD is 0.24 Debye, and the dipole moment of the hole injection layer is the dipole moment of the dimer combined by the F4-TCNQ and TPD, which is 5.15 Debye.

Since the first hole injection material and the second hole injection material are different materials, the dipole moments of these two materials are different, which are both non-polar. One of these two dipole moments attracts the electrons strongly, and the other attracts the electrons weakly, so that the positive electric centers are concentrated near the first hole injection material, and the negative electric centers are concentrated near the second hole injection material, so that the entire hole injection layer forms a larger dipole moment.

In an embodiment, referring to FIG. 1, the blue organic electroluminescence device further includes a hole auxiliary layer 41 (Prime) disposed between the light-emitting layer 4 and the hole transport layer 5 and used for adjusting the energy levels of the light-emitting layer 4 and the hole transport layer 5, so that the holes can smoothly enter the light-emitting layer. A dipole moment of a material of the hole auxiliary layer is 0 to 2 D, and the excessively high dipole moment will cause a significant decrease in the luminous efficiency.

The material of the hole auxiliary layer 41 may also be an arylamine derivative, a carbazole derivative, etc. For example, the material of the hole auxiliary layer may be one or a combination of NPB and TPD. In some embodiments, a dipole moment of the hole auxiliary layer is slightly smaller than that of the hole transport layer. Since the hole auxiliary layer is adjacent to the light-emitting layer, a large dipole moment will cause the loss of exciton energy, but a large dipole moment is beneficial to the transfer of holes. Accordingly, the balance is needed, and various embodiments disclosed herein include selecting the material with a smaller dipole moment value than the hole transport layer.

See Table 1 for structural formulas of the above compounds ADN, MADN, TPBA, DPASP, BNP3F, NPB, TPD, F4-TCNQ, TCNQ, HAT-CN, 2T-NATA.

TABLE 1
Structure of each material
ADN
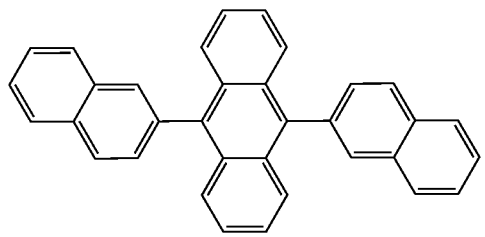 [SMILES: c1ccc2cc(-c3c4ccccc4c(-c4ccc5ccccc5c4)c4ccccc34)ccc2c1]
MADN
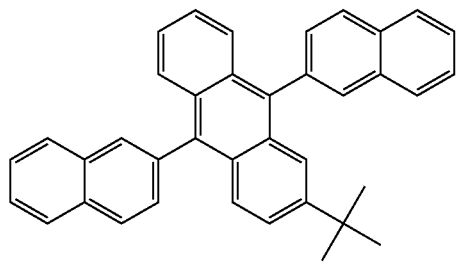 [SMILES: CC(C)(C)c1ccc2c(-c3ccc4ccccc4c3)c3ccccc3c(-c3ccc4ccccc4c3)c2c1]
TPBA
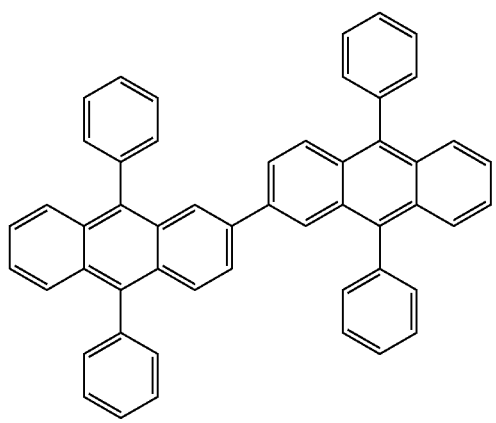 [SMILES: c1ccc(-c2c3ccccc3c(-c3ccccc3)c3cc(-c4ccc5c(-c6ccccc6)c6ccccc6c(-c6ccccc6)c5c4)ccc23)cc1]
BSBF
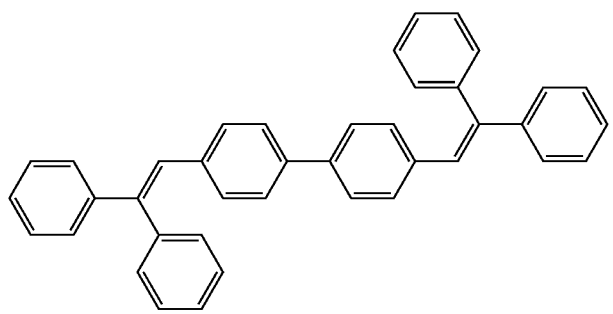 [SMILES: C(=C(c1ccccc1)c1ccccc1)c1ccc(-c2ccc(C=C(c3ccccc3)c3ccccc3)cc2)cc1]
BNP3F
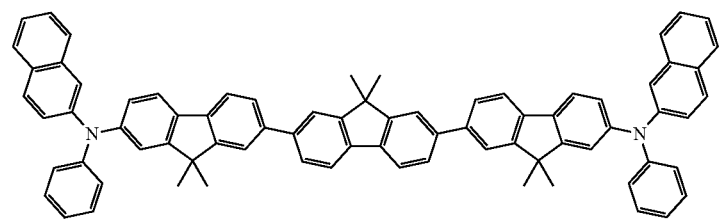 [SMILES: CC1(C)c2cc(-c3ccc4c(c3)C(C)(C)c3cc(N(c5ccccc5)c5ccc6ccccc6c5)ccc3-4)ccc2-c2ccc(-c3ccc4c(c3)C(C)(C)c3cc(N(c5ccccc5)c5ccc6ccccc6c5)ccc3-4)cc21]

TABLE 1-continued
Structure of each material
NPB
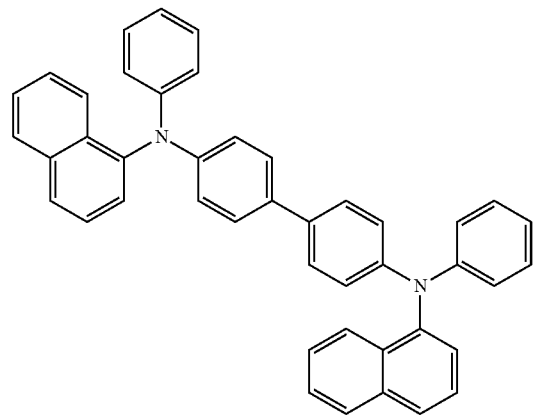 [SMILES: c1ccc(N(c2ccc(-c3ccc(N(c4ccccc4)c4cccc5ccccc45)cc3)cc2)c2cccc3ccccc23)cc1]
TPD
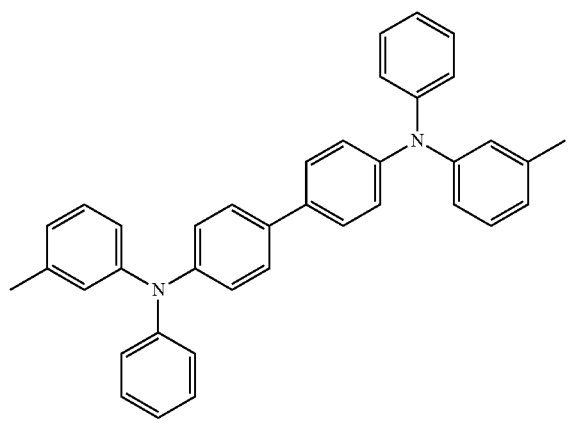
F4-TCNQ
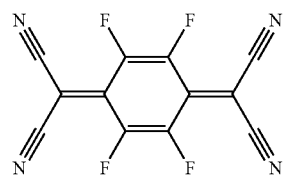 [SMILES: N#CC(C#N)=c1c(F)c(F)c(=C(C#N)C#N)c(F)c1F]
TCNQ
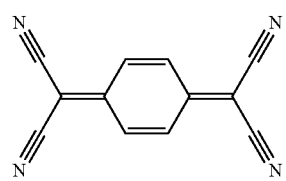 [SMILES: N#CC(C#N)=c1ccc(=C(C#N)C#N)cc1]

TABLE 1-continued

Structure of each material

HAT-CN

[chemical structure of HAT-CN]

2T-NATA

[chemical structure of 2T-NATA]

A manufacturing method of the blue organic electroluminescence device of the present disclosure is described below. In an embodiment, the following manufacturing method can be adopted:
① depositing an indium tin oxide (ITO) film with a thickness of 100 nm on a glass substrate with a vacuum of $1×10-5$ Pa by a vacuum evaporation method to form the anode 7;
② afterwards, co-evaporating the first hole injection material and the second hole injection material on the substrate to form the hole injection layer 6 (HIL) with a thickness of 10 nm, where concentrations of the first hole injection material and the second hole injection material in the hole injection layer 6 are both 50%;
③ evaporating the hole transport material with a thickness of 50 nm on the hole injection layer 6 (HIL) to function as the hole transport layer 5 (HTL);
④ co-evaporating the matrix material (BH) and the blue fluorescent doping material (BD) on the hole transport layer 5 (HTL) to form the light-emitting layer 4 (EML) with a thickness of 35 nm, where a concentration of the matrix material (BH) in the light-emitting layer 4 is 97%, and a concentration of the blue fluorescent doping material (BD) is 3%;
⑤ co-evaporating an electron transport material (ETM) and a LiQ material with a thickness of 30 nm on the light-emitting layer 4 (EML), which functions as an electron transport layer 3 (ETL);
⑥ evaporating LiF on the electron transport layer 3 (ETL) to form an electron injection layer 2 with a thickness of 1 nm; and
⑦ evaporating a metal Al on the electron injection layer 2 to form a metal cathode 1 with a film thickness of 80 nm, thereby completing the manufacturing of the blue organic electroluminescence device.

It should be noted that the materials of the electron transport layer and the electron injection layer applied in the embodiments are only an example, and the present disclosure does not limit the materials of the electron transport layer and the electron injection layer, that is, no matter what material of the dipole moment value is selected for the electron transport layer and the electron injection layer, it does not affect the beneficial effects of the present disclosure.

In order to verify the performance of the blue organic electroluminescence device of the present disclosure, four sets of comparative examples were also manufactured by the above method. Film materials of the experimental examples of the present disclosure and comparative examples 1 to 4 are shown in Table 2 below.

TABLE 2

| | Film materials of experimental examples and comparative examples 1 to 4 | | | |
|---|---|---|---|---|
| | HIL | HTL | BH | BD |
| comparative example 1 | HAT-CN+NPB | NPB | BH-01 | BD-01 |
| comparative example 2 | HAT-CN+NPB | NPB | BH-01 | BD-02 |
| comparative example 3 | HAT-CN+NPB | NPB | BH-02 | BD-01 |
| comparative example 4 | HAT-CN+ HT-01 | HT-01 | BH-02 | BD-02 |
| experimental example | HAT-CN+NPB | NPB | BH-02 | BD-02 |

Specific structural formulas of the above-mentioned BH-01, BH-02, BD-01, BD-02, and HT-01 are shown in Table 3.

TABLE 3

Material structure formula of experimental examples and comparative examples 1~4

BH-01

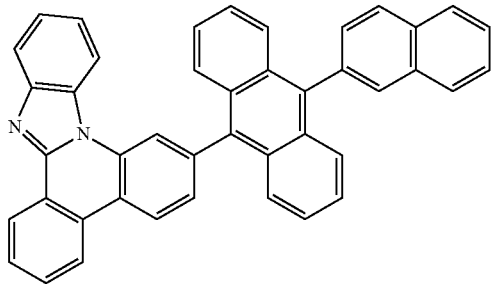 [SMILES: c1ccc2cc(-c3c4ccccc4c(-c4ccc5c6ccccc6c6nc7ccccc7n6c5c4)c4ccccc34)ccc2c1]

BH-02

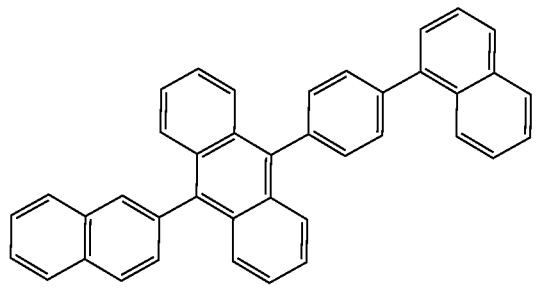 [SMILES: c1ccc2cc(-c3c4ccccc4c(-c4ccc(-c5cccc6ccccc56)cc4)c4ccccc34)ccc2c1]

BD-01

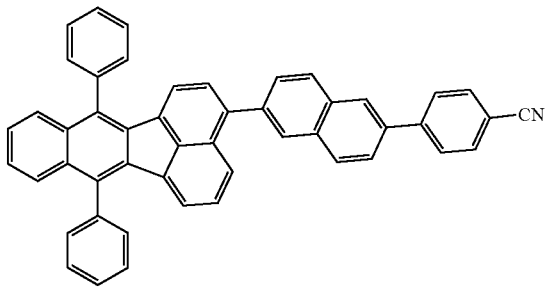 [SMILES: N#Cc1ccc(-c2ccc3cc(-c4ccc5c6c(cccc46)-c4c-5c(-c5ccccc5)c5ccccc5c4-c4ccccc4)ccc3c2)cc1]

TABLE 3-continued

Material structure formula of experimental examples and comparative examples 1~4

BD-02

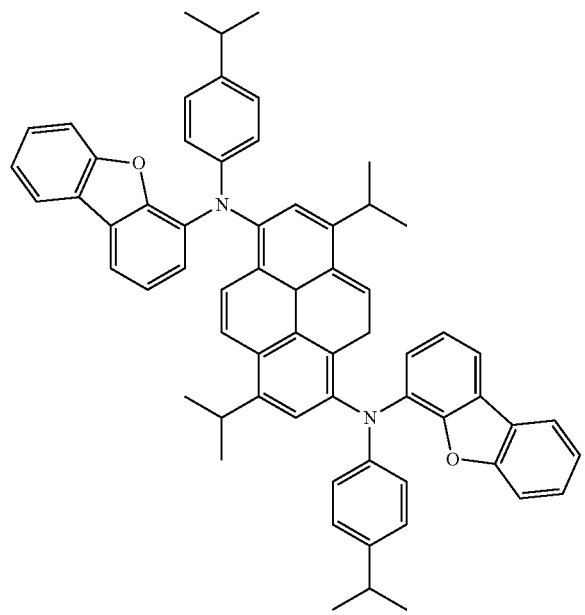 [SMILES: CC(C)C1=CC(N(c2ccc(C(C)C)cc2)c2cccc3c2oc2ccccc23)=C2C=Cc3c(C(C)C)cc(N(c4ccc(C(C)C)cc4)c4cccc5c4oc4ccccc45)c4c3C2C1=CC4]

HT-01

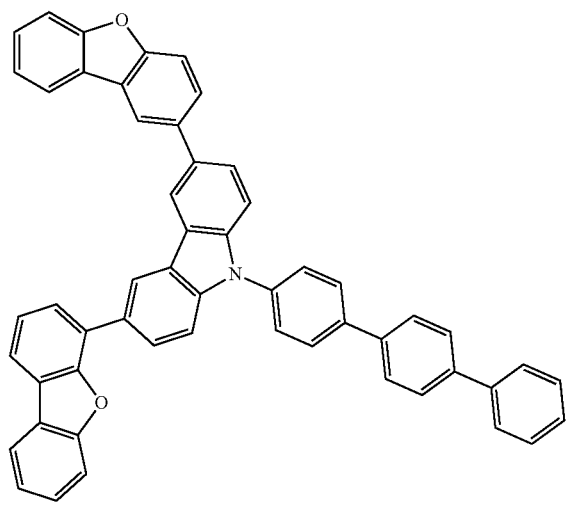 [SMILES: c1ccc(-c2ccc(-c3ccc(-n4c5ccc(-c6ccc7oc8ccccc8c7c6)cc5c5cc(-c6cccc7c6oc6ccccc67)ccc54)cc3)cc2)cc1]

TABLE 4

Dipole moments of individual films of experimental examples and comparative examples 1 to 4 when different materials are chosen

| Functional layer | | Compound | Dipole moment |
|---|---|---|---|
| EML | BH | BH-01 | 3.33 |
| | | BH-02 | 0.13 |
| | BD | BD-01 | 5.55 |
| | | BD-02 | 0.12 |
| HTL | | NPB | 0.46 |
| | | HT-01 | 1.98 |
| HIL | | HAT-CN+NPB | 2.84 |
| | | HAT-CN+HT-01 | 2.64 |

A driving voltage and luminous efficiency of each blue organic electroluminescence device manufactured by the above method are measured at a fixed current density, and the results are shown in table 5 below.

TABLE 5

Test result of experimental examples and comparative examples 1 to 4 when different materials are chosen

| | Driving voltage | Luminous efficiency | Full width at half height | CIE (x) | CIE (y) |
|---|---|---|---|---|---|
| comparative example 1 | 100% | 100% | 100% | 0.127 | 0.152 |
| comparative example 2 | 104% | 102% | 93% | 0.127 | 0.140 |
| comparative example 3 | 106% | 103% | 100% | 0.127 | 0.145 |

TABLE 5-continued

Test result of experimental examples and comparative examples 1 to 4 when different materials are chosen

|  | Driving voltage | Luminous efficiency | Full width at half height | CIE (x) | CIE (y) |
|---|---|---|---|---|---|
| comparative example 4 | 101% | 106% | 93% | 0.127 | 0.112 |
| experimental example | 106% | 112% | 93% | 0.127 | 0.112 |

It can be seen from the table 5 that each functional layer in the comparative example 1 has a larger dipole moment, so that the device has a lower driving voltage; in addition, a larger dipole moment of the molecule between Prime and the light-emitting layer causes a larger intermolecular interaction, and thus the comparative example 4 is slightly lower than that of the experimental example; the BH with the large molecular dipole moment in the comparative examples 2 and 3 may make it more difficult for BD to trap the excitons, and then the luminous efficiency will decrease. The interaction of BH and BD may also degrade the color purity of light emission. Therefore, the light-emitting device of the embodiments has higher luminous efficiency and better color purity.

Through the analysis of the above results, the polar molecules with larger dipole moments in the hole injection layer, the hole transport layer and the hole auxiliary layer can improve the ability of introducing electrons from the cathode to inject and transport. In addition, the molecules with a large dipole moment can make the molecules have good orientation in the film and provide a good and dense film. However, the molecules of the hole transport layer and/or hole auxiliary layer are in contact with the light-emitting layer, and the molecules of the hole transport layer and/or hole auxiliary layer with too large dipole moment may have a greater interaction with the molecules in the light-emitting layer, resulting in the loss of exciton energy, and the performance degradation of the device cannot be ignored. Therefore, when the molecules of the hole injection layer, the hole transport layer, and the hole auxiliary layer are selected according to the dipole moment defined in the present disclosure, the light-emitting device can be made to have good film-forming properties and light-emitting performance.

In short, when the dipole moment of each functional layer of the organic light emitting diode meets the requirement of the present disclosure, it can be confirmed that the color purity is improved, the full width at half maximum is smaller, and the device efficiency is relatively higher.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described as "above" will become a component "below" another component. When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate the existence of one or more elements/ components or the like; the terms "include" and "have" are used to indicate an open meaning of including and means that there may be additional elements/components/etc. in addition to the listed elements/components/etc.

Other embodiments of the present disclosure will be apparent to those skilled in the art after those skilled in the art consider the specification and practice the technical solutions disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A blue organic electroluminescence device, comprising:
    a light-emitting layer comprising a matrix material and a blue fluorescent doping material doped in the matrix material, wherein dipole moments of the matrix material and the blue fluorescent doping material are both 0 to 1 D; and
    a hole transport layer located on a side of the light-emitting layer, wherein a dipole moment of a material of the hole transport layer is 0 to 2 D.

2. The blue organic electroluminescence device according to claim 1, wherein the matrix material is selected from anthracene derivatives.

3. The blue organic electroluminescence device according to claim 2, wherein the matrix material is selected from one or any combination of 9,10-bi-(naphthalene-2-yl) anthracene, 2-methyl-9,10-bis(naphthalene-2-yl) anthracene and 9,9',10,10'-tetraphenyl-2,2'-bianthracene.

4. The blue organic electroluminescence device according to claim 1, wherein the blue fluorescent doping material is selected from one or any combination of pyrene derivatives, fluorene derivatives, and fused ring compounds.

5. The blue organic electroluminescence device according to claim 4, wherein the doping material is selected from (E)-N,N-diphenyl-4-(4-(pyrene-1-yl) styryl) aniline, 9,9,9', 9',9'',9''-hexamethyl-N,N'-di-2-naphthyl-N,N'-diphenyl-[2, 2':7',2''-triple-9H-fluorene]-7,7''-diamine.

6. The blue organic electroluminescence device according to claim 1, wherein the blue organic electroluminescence device further comprises:
    a hole auxiliary layer located between the hole transport layer and the light-emitting layer, wherein a dipole moment of a material of the hole auxiliary layer is 0 to 2 D.

7. The blue organic electroluminescence device according to claim 6, wherein the dipole moment of the material of the hole auxiliary layer is greater than the dipole moment of the material of the hole transport layer.

8. The blue organic electroluminescence device according to claim 6, wherein the material of the hole transport layer and/or the material of the hole auxiliary layer are/is selected from aromatic amine derivatives.

9. The blue organic electroluminescence device according to claim 8, wherein the material of the hole transport layer and/or the material of the hole auxiliary layer are/is selected from one or a combination of N,N'-diphenyl-N,N'-(1-naphthyl)-1,1'-biphenyl-4,4'-diamine and N,N'-diphenyl-N,N'-bis(3-methylphenyl)-1,1'-biphenyl-4,4'-diamines.

10. The blue organic electroluminescence device according to claim 1, wherein the blue organic electroluminescence device further comprises:

a hole injection layer located on a side of the hole transport layer away from the light-emitting layer, wherein a dipole moment of a material of the hole injection layer is greater than 2 D.

11. The blue organic electroluminescence device according to claim 10, wherein the hole injection layer comprises a first hole injection material and a second hole injection material, wherein the second hole injection material is same as the material of the hole transport layer, wherein the dipole moment of the material of the hole injection layer is a common dipole moment of a dimer combined by the first hole injection material and the second hole injection material.

12. The blue organic electroluminescence device according to claim 11, wherein the first hole injection material is selected from one of any combination of 2,3,5,6-tetrafluoro-7,7',8,8'-tetracyanodimethyl-p-benzeneQuinone, 7,7,8,8-tetracyanoquinodimethane, 2,3,6,7,10,11-hexacyano-1,4,5,8,9,12-hexaazide, 4,4',4"-tris[2-naphthylphenylamino]triphenylamine, axene or quinone compounds.

13. A display panel, comprising:

a blue organic electroluminescence device, comprising:

a light-emitting layer comprising a matrix material and a blue fluorescent doping material doped in the matrix material, wherein dipole moments of the matrix material and the blue fluorescent doping material are both 0 to 1 D; and a hole transport layer located on a side of the light-emitting layer, wherein a dipole moment of a material of the hole transport layer is 0 to 2 D.

14. The display panel according to claim 13, wherein the display panel is implemented in a display apparatus.

15. The display panel according to claim 13, wherein the matrix material is selected from anthracene derivatives.

16. The display panel according to claim 15, wherein the matrix material is selected from one or any combination of 9,10-bi-(naphthalene-2-yl) anthracene, 2-methyl-9,10-bis (naphthalene-2-yl) anthracene and 9,9',10,10'-tetraphenyl-2, 2'-bianthracene.

17. The display panel according to claim 13, wherein the blue fluorescent doping material is selected from one or any combination of pyrene derivatives, fluorene derivatives, and fused ring compounds.

18. The display panel according to claim 17, wherein the doping material is selected from (E)-N,N-diphenyl-4-(4-(pyrene-1-yl)styryl)aniline, 9,9,9',9',9",9"-hexamethyl-N, N'-di-2-naphthyl-N,N'-diphenyl-[2,2':7',2"-triple-9H-fluorene]-7,7"-diamine.

* * * * *